United States Patent [19]
Prado

[11] Patent Number: 6,057,742
[45] Date of Patent: May 2, 2000

[54] LOW POWER OSCILLATOR HAVING FAST START-UP TIMES

[75] Inventor: Louis A. Prado, Tempe, Ariz.

[73] Assignee: Microchip Technology Incorporated, Chandler, Ariz.

[21] Appl. No.: 09/088,160

[22] Filed: Jun. 1, 1998

[51] Int. Cl.[7] .............................. H03B 5/32; H03L 3/00
[52] U.S. Cl. .................................. 331/158; 331/116 FE; 331/173
[58] Field of Search .................... 331/116 R, 116 FE, 331/158, 173

[56] References Cited

U.S. PATENT DOCUMENTS 5,923,222  7/1999  Russell et al. ...................... 331/116 R

*Primary Examiner*—Siegfried H. Grimm
*Attorney, Agent, or Firm*—Paul N. Katz; R. William Beard, Jr.; Frohwitter

[57] ABSTRACT

A low power oscillator having fast start-up times. The low power fast starting oscillator uses an oscillator circuit having an input and an output for generating a signal of a desired frequency. A start-up detect circuit is coupled to the output of the oscillator circuit for detecting when the oscillator circuit has reached steady state operation and for generating a start-up circuit output signal which adjusts the gain of the oscillator circuit when steady state operation has been reached by the oscillator circuit. A noise generator is coupled to the input of the oscillator circuit and to the start-up detect circuit for inputting a noise pulse into the oscillator circuit. The noise pulse is used for biasing the input of the oscillator circuit to approximately an optimal bias voltage level. The noise generator is further used for sending an enable start-up detect signal to the start-up detect circuit to activate the start-up detect circuit. A prestress circuit is coupled to the input and to the output of the oscillator circuit for prestressing a piezoelectric resonator of the oscillator circuit to shorten start-up times of the oscillator circuit. The prestress circuit is further used for sending an enable noise generator signal to the noise generator to activate the noise generator.

55 Claims, 8 Drawing Sheets

LOW POWER OSCILLATOR HAVING FAST START-UP TIMES

BACKGROUND OF THE INVENTION

1. Field of the Invention

This invention relates generally to oscillators and, more specifically, to a piezoelectric based oscillator which consumes less power and which has faster start-up times than prior art oscillators.

2. Description of the Prior Art

The start-up time of an oscillator is defined as the time required for the oscillator to reach a steady state. Presently, for most oscillators, the start-up time can be several seconds depending on the crystal frequency and amplifier design of the oscillator. The start-up time may be even longer when the temperature of the device using the oscillator increases. This creates a problem since the start-up times may be fairly long and unpredictable.

The reason for the delay is that when the oscillator circuit is powered up, the output of the amplifying inverter begins to bias the input through a bias resistor. The bias resistor and the load capacitors are large and the amplifying inverter may be weak. This causes considerable delay for the oscillator circuit to reach appropriate bias levels.

Once the amplifying inverter of the oscillator circuit is biased to its region of maximum gain, the amplifying inverter is unstable. The oscillator circuit relies on thermal noise to provide excitation energy at the piezoelectric resonator's resonant frequency. The problem with thermal noise is that thermal noise has low energy, varies with operating conditions, and is white noise which means that the noise is equally distributed over a given frequency band. Thus, there is just as much energy at the piezoelectric resonator's overtone and spurious frequencies as there is at the piezoelectric resonator's fundamental frequency.

After start-up, the oscillator circuit losses cause the oscillator circuit to stabilize (i.e., loop gain is approximately one). The oscillator circuit then enters a steady state operating mode. However, high gain was required to ensure a fast and reliable start-up. This creates a problem since in steady state operation, the high gain wastes power. Furthermore, the high gain may result in piezoelectric resonator overdrive.

Therefore, a need existed to provide an improved oscillator. The improved oscillator must have faster start-up times than present oscillators. The improved oscillator must further have faster and more predictable start-up times even though operating conditions may fluctuate and change. The improved oscillator must further provide excitation energy at the piezoelectric resonator's resonant frequency once the amplifying inverter is biased to a region of maximum gain, without relying on thermal noise. The improved oscillator must provide excitation energy at the piezoelectric resonator's resonant frequency by injecting a high energy noise pulse whose spectral energy decreases with increasing frequency. The improved oscillator must reduce power consumption by lowering the high gain that was required for a fast reliable start-up. The improved oscillator must monitor the output of the oscillator circuit to determine when steady-state operation has been achieved and then lower the gain of the oscillator circuit.

SUMMARY OF THE INVENTION

In accordance with one embodiment of the present invention, it is an object of the present invention to provide an improved oscillator.

It is another object of the present invention to provide an improved oscillator that has faster start-up times than present oscillators.

It is still another object of the present invention to provide an improved oscillator that has faster and more predictable start-up times even though operating conditions of the improved oscillator may fluctuate and change.

It is still another object of the present invention to provide an improved oscillator that provides excitation energy at the piezoelectric resonator's resonant frequency once the amplifying inverter is biased to a region of maximum gain without relying on thermal noise.

It is a further object of the present invention to provide an improved oscillator that provides an excitation energy at the piezoelectric resonator's resonant frequency by injecting a high energy noise pulse whose spectral energy decreases with increasing frequency.

It is still a further object of the present invention to provide an improved oscillator that reduces power consumption by lowering the high gain that was required for a fast reliable start-up.

It is still another object of the present invention to provide an improved oscillator that monitors the output of the oscillator circuit to determine when steady-state operation has been achieved and then lowers the gain of the oscillator circuit.

BRIEF DESCRIPTION OF THE PREFERRED EMBODIMENTS

In accordance with one embodiment of the present invention, a low power oscillator having fast start-up times is disclosed. The oscillator has an oscillator circuit for generating a signal of a desired frequency. A prestress circuit is coupled to an input and to an output of the oscillator circuit for prestressing a piezoelectric resonator of the oscillator circuit to shorten start-up times of the oscillator circuit.

In accordance with another embodiment of the present invention, a low power oscillator having fast start-up times is disclosed. The low power fast starting oscillator uses an oscillator circuit having an input and an output for generating a signal of a desired frequency. A start-up detect circuit is coupled to the output of the oscillator circuit for detecting when the oscillator circuit has reached steady state operation and for generating a start-up circuit output signal which adjusts the gain of the oscillator circuit when steady state operation has been reached by the oscillator circuit. A noise generator is coupled to the input of the oscillator circuit and to the start-up detect circuit for inputting a noise pulse into the oscillator circuit. The noise pulse is used for biasing the input of the oscillator circuit to approximately an optimal bias voltage level. The noise generator is further used for sending an enable start-up detect signal to the start-up detect circuit to activate the start-up detect circuit. A prestress circuit is coupled to the input and to the output of the oscillator circuit for prestressing a piezoelectric resonator of the oscillator circuit to shorten start-up times of the oscillator circuit. The prestress circuit is further used for sending an enable noise generator signal to the noise generator to activate the noise generator.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
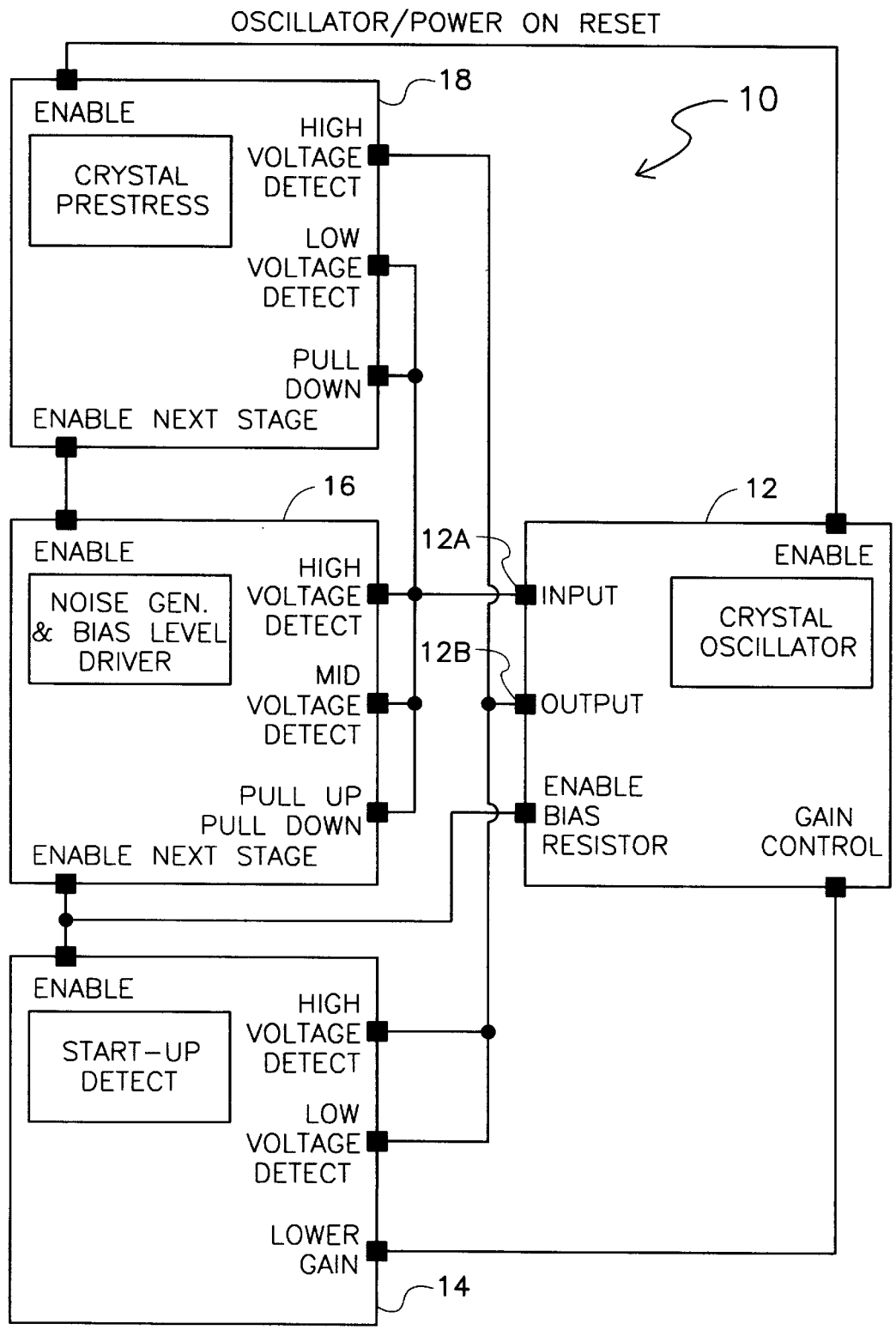
FIG. 1 is a simplified functional block diagram of the low power fast starting oscillator of the present invention.

Referring to FIG. 1, a low power fast start-up oscillator 10 (hereinafter oscillator 10) is shown. The oscillator 10 uses an oscillator circuit 12 having an input 12A and an output 12B for generating a signal having a desired frequency. A start-up detect circuit 14 is coupled to the output 12B of the oscillator circuit 12. The start-up detect circuit 14 is used for detecting when the oscillator circuit 12 has reached steady state operation and for generating a start-up circuit output signal which adjusts a gain of the oscillator circuit 12 when steady state operation has been reached by the oscillator circuit 12.

A noise generator 16 is coupled to the input 12A of the oscillator circuit 12 and to the start-up detect circuit 14. The noise generator 16 is used for inputting a noise pulse into the oscillator circuit 12. The noise pulse is used for biasing the input 12A of the oscillator circuit 12 to approximately an optimal bias voltage level. The noise generator 16 is further used for sending an enable start-up detect signal to activate the start-up detect circuit 14.

A prestress circuit 18 is coupled to the input 12A and to the output 12B of the oscillator circuit 12. The prestress circuit 18 is used for prestressing a piezoelectric resonator of the oscillator circuit 12 to shorten start-up times of the oscillator circuit 12. The prestress circuit 18 is further used for sending an enable noise generator signal to the noise generator 16 to activate the noise generator 16.

Figure 5:
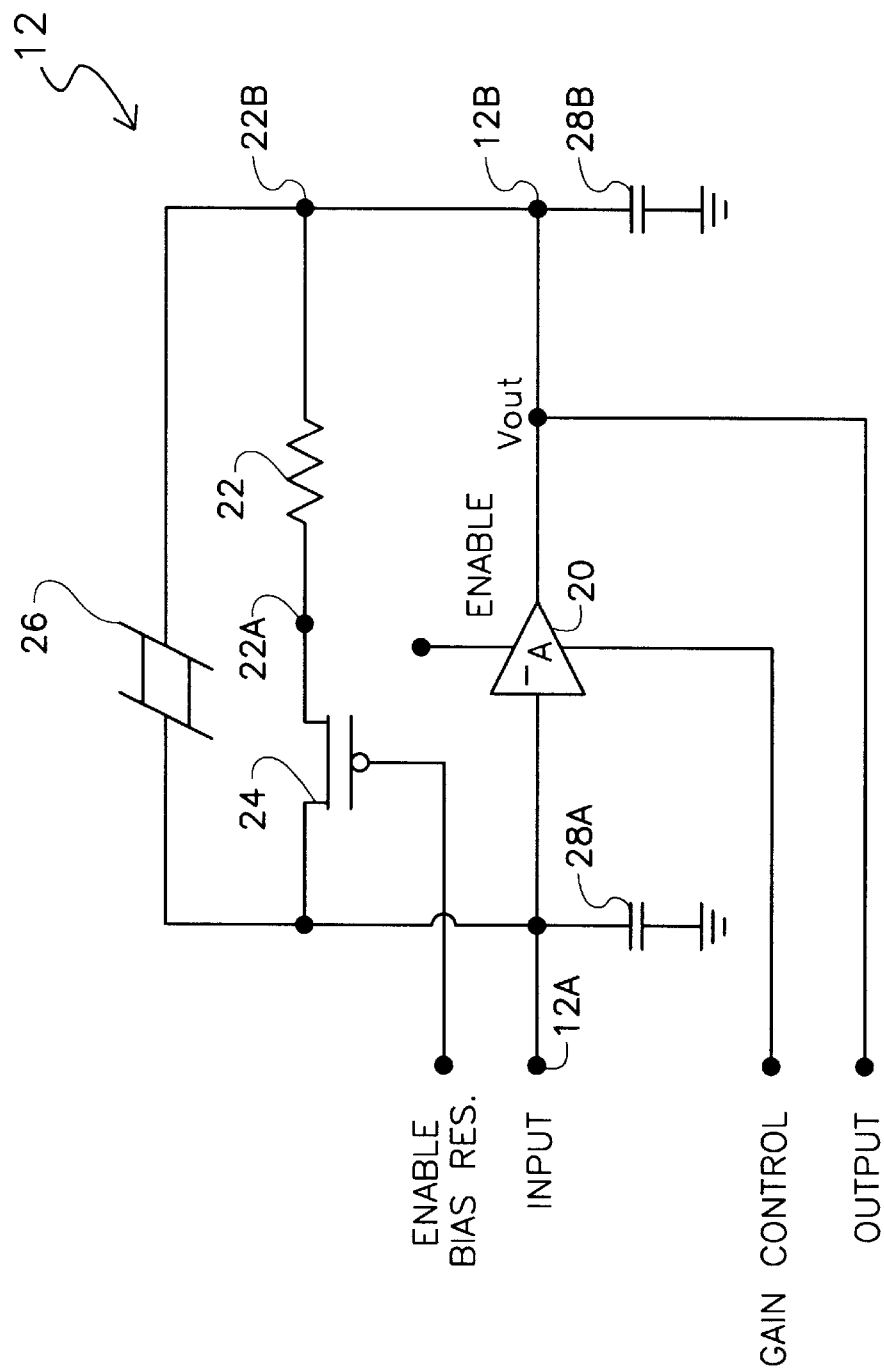
FIG. 5 is a simplified electrical schematic of an oscillator circuit used in the low power fast starting oscillator depicted in FIG. 1.

Referring now to FIG. 5 wherein like numerals and symbols represent like elements, the oscillator circuit 12 is shown in detail. The oscillator circuit 12 uses an amplifier 20. In the preferred embodiment of the present invention, the amplifier 20 is an inverting amplifier. A resistive element 22 is coupled to the inverting amplifier 20. The resistive element 22 has a first terminal 22A which is coupled to an input of the inverting amplifier 20 through a switch 24 and a second terminal 22B which is coupled to an output of the inverting amplifier 20. The resistive element 22 is used to bias the operation of the inverting amplifier 20 into a linear operating region.

In the preferred embodiment of the present invention, the oscillator circuit 12 uses a switch 24. The switch 24 has a first terminal which is coupled to the first terminal 22A of the resistor 22, a second terminal which is coupled to the start-up detect circuit 14, and a third terminal which is coupled to the input of the inverting amplifier 20. The switch 24 is used to activate and deactivate the resistor 22. In the embodiment depicted in FIG. 5, the switch 24 is a P-channel transistor switch. However, it should be noted that other types of switch mechanisms may be used without departing from the spirit and scope of the present invention.

A piezoelectric resonator 26 is also coupled to the input and to the output of the inverting amplifier 20. The piezoelectric resonator 26 may be a crystal resonator or a ceramic resonator. The piezoelectric resonator 26 is used to control the frequency of oscillation of the oscillator circuit 12.

The oscillator circuit 12 has a pair of capacitive elements. A first capacitive element 28A has a first terminal which is coupled to the input of the inverting amplifier 20 and a second terminal which is coupled to ground. A second capacitive element 28B has a first terminal which is coupled to the output of the inverting amplifier 20 and a second terminal which is coupled to ground. The pair of capacitive elements 28A and 28B are used for adjusting the gain of the inverting amplifier 20.

When the oscillator circuit 12 is powered up, the output of the inverting amplifier 20 begins to bias the input through the resistor 22. The resistor 22 and the pair of capacitors 28A and 28B are large and the inverting amplifier 20 may be weak. This causes considerable delay for the oscillator circuit 12 to reach appropriate bias levels.

Because of the start-up delay, a prestress circuit 18 is coupled to the input 12A and to the output 12B of the oscillator circuit 12. The prestress circuit 18 is used for prestressing the piezoelectric resonator 26 of the oscillator circuit 12 in order to quicken start-up times of the oscillator circuit 12.

Figure 2A:
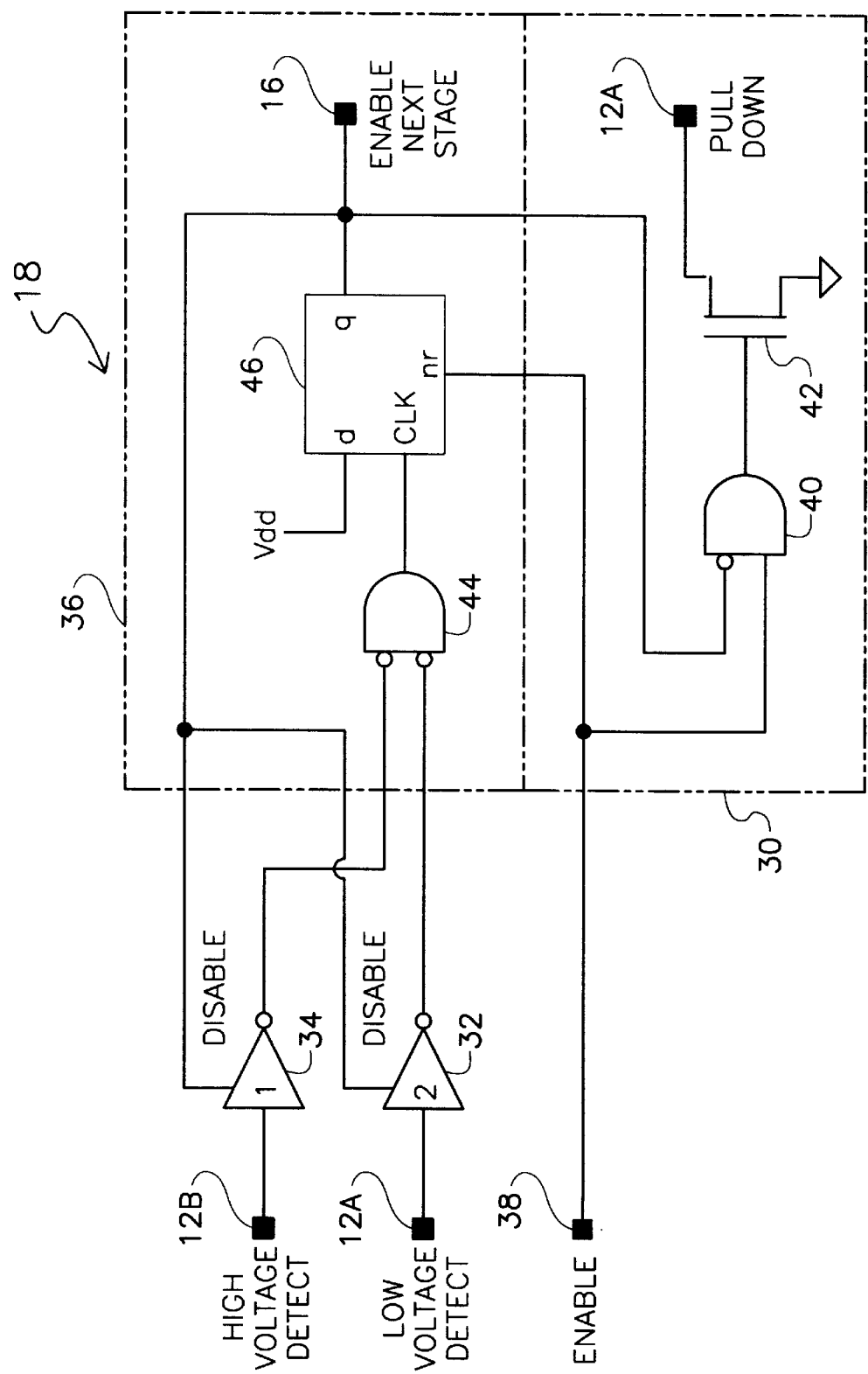
FIG. 2A is a simplified electrical schematic of a piezoelectric resonator prestress circuit used in the low power fast starting oscillator depicted in FIG. 1.

Referring now to FIGS. 1 and 2A wherein like numerals and symbols represent like elements, the prestress circuit 18 will be described. The prestressing circuit 18 is used to apply a brief DC voltage across the piezoelectric resonator 26 (FIG. 5). The applied voltage will prestress the piezoelectric resonator 26 so that the piezoelectric resonator 26 is ready to oscillate.

The prestress circuit 18 has a prestress pull-down circuit 30, a prestress low voltage detector 32, a prestress high voltage detector 34, and an enabling circuit 36. The prestress pull-down circuit 30 is coupled to the input 12A of the oscillator circuit 12, to an enable signal line 38 which is used to enable the prestress circuit 18, and to the enabling circuit 36. The prestress pull-down circuit 30 is used for lowering the voltage level to the input 12A of the oscillator circuit 12.

The prestress pull-down circuit 30 has a logic gate 40 which has a first input coupled to an inverted output of the enabling circuit 36, and a second input coupled to the enable signal line 38. The output of the logic gate 40 is coupled to a transistor 42. The transistor 42 has a first terminal which is coupled to the input 12A of the oscillator circuit 12. A second terminal of the transistor 42 is coupled to the output of the logic gate 40. A third terminal of the transistor 42 is grounded. In the embodiment shown in FIG. 2A, the logic gate 40 is an AND gate and the transistor 42 is an N-channel transistor. However, it should be noted that the pull-down circuit 30 may be modified such that other types of logic gates and transistors may be used without departing from the spirit and scope of the invention.

When the oscillator 10 is first enabled (i.e., oscillator start-up signal or a power on reset signal), the enable signal line 38 will send a signal to the logic gate 40 which causes the logic gate 40 to output a high signal. The high signal will activate the transistor 42. With the transistor 42 activated, the input 12A of the oscillator circuit 12 will be pulled-down towards ground potential. Thus, the input of the amplifier 20 will also be at ground potential. Since the amplifier 20 is an inverting amplifier, the output of the amplifier 20 will be at a high level. Since the piezoelectric resonator 26 is also coupled to the input and to the output of the amplifier 20, one terminal of the piezoelectric resonator 26 will be at ground potential while the other terminal of the piezoelectric resonator 26 will be at a high level. Thus, a voltage is applied across the piezoelectric resonator 26. The piezoelectric resonator 26 is now stressed and ready to oscillate.

The low voltage detector 32 is coupled to the input 12A of the oscillator circuit 12. The low voltage detector 32 is used to monitor the input voltage to the oscillator circuit 12. When the voltage at the input 12A of the oscillator circuit 12 is pulled to or below a predetermined low voltage level, the low voltage detector 32 will trip and send a high signal to the enabling circuit 36.

The high voltage detector 34 is coupled to the output 12B of the oscillator circuit 12. The high voltage detector 34 is used to monitor the output 12B of the oscillator circuit 12. When the voltage at the output 12B of the oscillator circuit 12 reaches or exceeds a predetermined high voltage level, the high voltage detector 34 will trip and send a high signal to the enabling circuit 36.

In the preferred embodiment of the present invention, the low voltage detector 32 and the high voltage detector 34 are both inverters. A standard inverter is generally comprised of a P-channel transistor which is coupled to an N-channel transistor. Those skilled in the art will recognize that by altering the width to length ratio of the P-channel transistor to the N-channel transistor, one may alter the value at which the inverters will trip.

The enabling circuit 36 has a logic gate 44 coupled to the outputs of both the low voltage detector 32 and the high voltage detector 34. In the embodiment shown in FIG. 2A, the logic gate 44 is an AND gate. However, it should be noted that the enabling circuit 36 may be modified such that other types of logic gates may be used without departing from the spirit and scope of the invention.

The output of the logic gate 44 is coupled to a latch 46. The latch 46 has a first input which is coupled to a bias voltage source. A second input of the latch 46 is coupled to the output of the logic gate 44, and a third input of the latch 46 is coupled to the enable signal line 38. When both the low voltage detector 32 and the high voltage detector 34 trip, the logic gate 44 will send a high signal to the latch 46. The latch 46 will then send an enable noise generator signal to the noise generator 16.

Figure 2B:
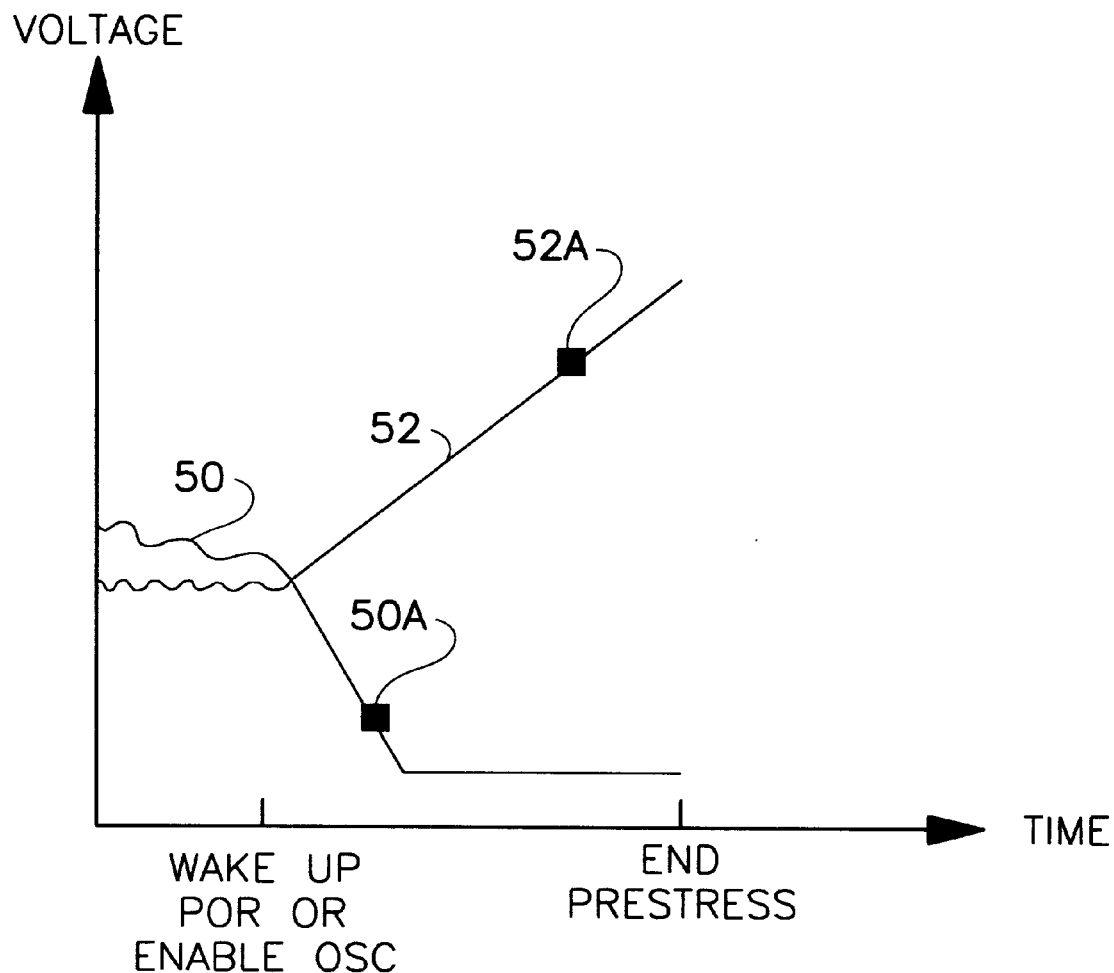
FIG. 2B depicts the voltage waveform for the low power fast starting oscillator depicted in FIG. 1 when the piezoelectric resonator prestress circuit is activated.

Referring now to FIGS. 2A and 2B, FIG. 2B depicts a voltage diagram of the oscillator circuit 12 when the prestress circuit 18 is activated. When the oscillator circuit 12 (FIG. 1) is enabled, the latch 46 will be reset. The prestress pull-down circuit 30 will begin to pull down the input voltage (line 50). As the input voltage decreases, the output voltage (line 52) of the oscillator circuit 12 rises. When the input voltage falls to a predetermined low voltage level 50A, the low voltage detector 32 will trip. The output voltage 53 will continue to rise. Once the output voltage reaches a predetermined high voltage level 52A, the high voltage detector 34 trips. When both the low voltage detector 32 and the high voltage detector 34 (FIG. 2A) trip, the logic gate 44 will send a high signal to the latch 46. The latch 46 will then send an enable noise generator signal to the noise generator 16.

The oscillator circuit 12 relies on thermal noise to provide excitation energy at the piezoelectric resonator's resonant frequency. As stated above, the problem with thermal noise is that thermal noise has low energy, varies with operating conditions, and is white noise which means that the noise is equally distributed over a given frequency band. Thus, there is just as much energy at the piezoelectric resonator's overtone and spurious frequencies as there is at the piezoelectric resonator's fundamental frequency.

Because of the above problem, the oscillator 10 uses a noise generator 16. The noise generator 16 injects a high energy noise pulse whose spectral energy decreases with increasing frequency into the input 12A of the oscillator circuit 12. This leaves the input 12A of the oscillator circuit 12 at or near the input's optimal bias voltage level.

Figure 3A:
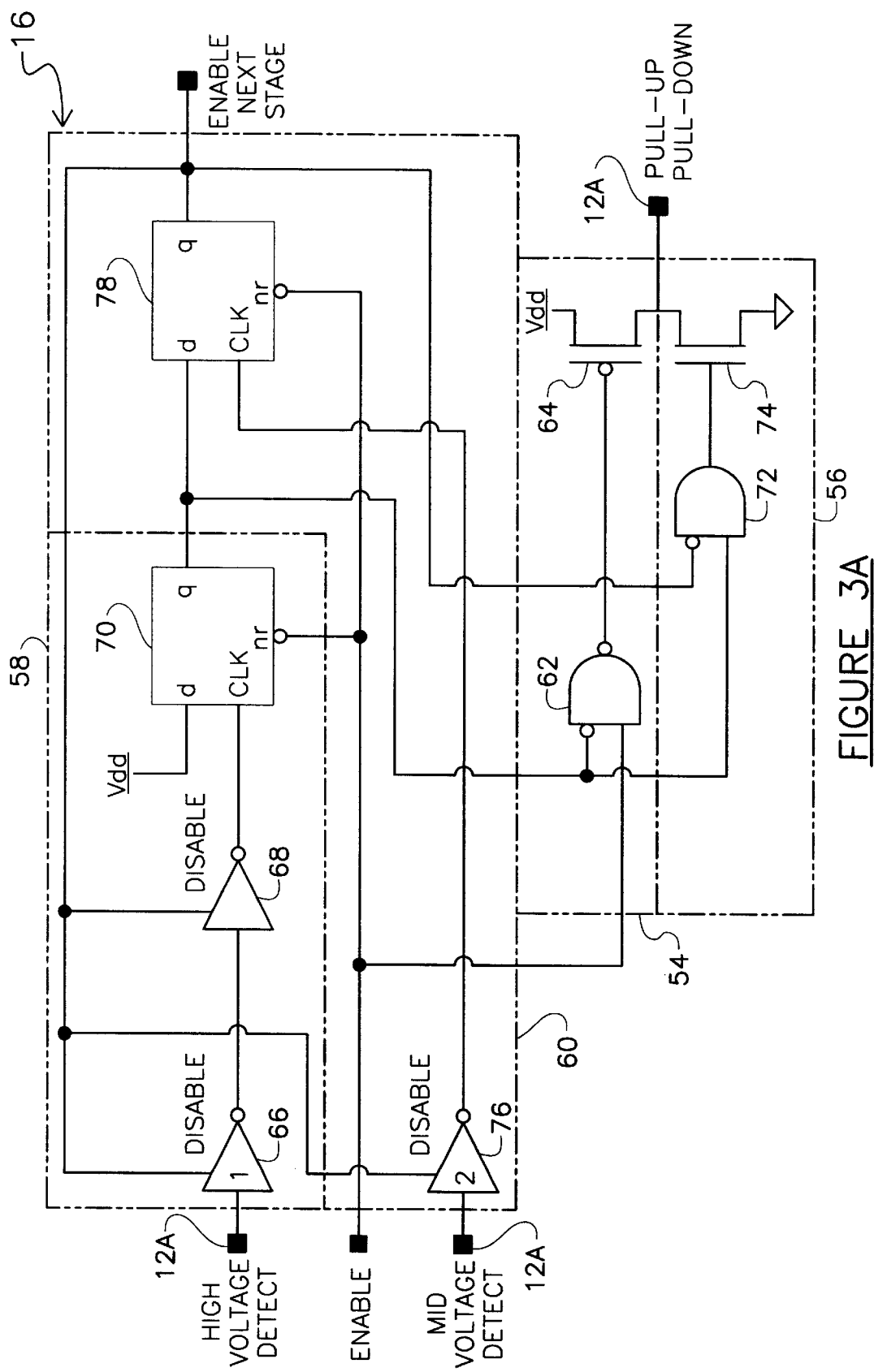
FIG. 3A is a simplified electrical schematic of a noise generator used in the low power fast starting oscillator depicted in FIG. 1.

Referring now to FIGS. 1 and 3A wherein like numerals and symbols represent like elements, the noise generator 16 will be described. The noise generator 16 has a noise generator pull-up circuit 54, a noise generator pull-down circuit 56, a noise generator high voltage detector 58, and a noise generator mid-voltage detector 60. The noise generator pull-up circuit 54 is coupled to the input 12A of the oscillator circuit 12. The noise generator pull-up circuit 54 is used for increasing the voltage level to the input 12A of the oscillator circuit 12 after the prestress circuit 18 has prestressed the piezoelectric resonator 26.

The noise generator pull-up circuit 54 is comprised of a logic gate 62. The logic gate 62 has an inverted input coupled to the output of the noise generator high voltage detector 58. A second input of the logic gate 62 is coupled to the enable noise generator signal which is outputted by the prestress circuit 18. In the embodiment shown in FIG. 3A, the logic gate 62 is a NAND gate.

When the enable noise generator signal is outputted by the prestress circuit 18, the logic gate 62 will activate a pull-up transistor 64. The pull-up transistor 64 has a first terminal coupled to a bias voltage source, a second terminal coupled to the output of the logic gate 62, and a third terminal coupled to the input 12A of the oscillator circuit 12. With the pull-up transistor 64 activated, the input 12A of the oscillator circuit 12 will be pulled towards the bias voltage level of the pull-up transistor 64. In the embodiment shown in FIG. 3A, the pull-up transistor 64 is a P-channel transistor. Those skilled in the art will recognize that the noise generator pull-up circuit 54 may be modified such that other types of logic gates and transistors may be used without departing from the spirit and scope of the invention.

After the noise generator pull-up circuit 54 raises the input voltage of the oscillator 12 to a predetermined noise generator high voltage level, the noise generator high voltage detector 58 will trip. In the embodiment depicted in FIG. 3A, the high voltage detector 58 has a first inverter 66 which has an input coupled to the input 12A of the oscillator circuit 12. The output of the first inverter 66 is coupled to an input of a second inverter 68. The output of the second inverter 68 is coupled to a latch 70. The latch 70 has a first input coupled to a bias voltage source, a second input coupled to the output of the second inverter 68, and a third input coupled to the enable noise generator signal.

A standard inverter is generally comprised of a P-channel transistor which is coupled to an N-channel transistor. Those skilled in the art will recognize that by altering the width to length ratio of the P-channel transistor to the N-channel transistor, one may alter the value at which the first inverter 66 will trip, thereby enabling one to set the predetermined noise generator high voltage level.

When the noise generator high voltage detector 58 trips, the latch 70 will output a signal which will cause the logic gate 62 to turn off the pull-up transistor 64. The signal from the latch 70 will further activate the noise generator pull-down circuit 56. The noise generator pull-down circuit 56 is used for decreasing the voltage level at the input 12A of the oscillator circuit 12.

The noise generator pull-down circuit 56 has a logic gate 72 and a pull-down transistor 74. The logic gate 72 has an inverted input coupled to an output of the noise generator mid-voltage detector 60, and a second input coupled to the output of the noise generator high voltage detector 58. The pull-down transistor 74 has a first terminal coupled to the input 12A of the oscillator circuit 12, a second terminal coupled to the output of the logic gate 72, and a third terminal coupled to ground. In the embodiment depicted in FIG. 3A, the logic gate 72 is an AND gate and the pull-down transistor 74 is an N-channel transistor. However, those skilled in the art will recognize that the noise generator pull-down circuit 56 may be modified such that other types of logic gates and transistors may be used without departing from the spirit and scope of the invention.

When the noise generator high voltage detector 58 trips, the output signal from the latch 70 will cause the logic gate 72 to activate the pull-down transistor 74. With the pull-down transistor 74 activated, the voltage at the input 12A of the oscillator circuit 12 will be pulled towards ground potential. As soon as the voltage at the input 12A is lowered to a predetermined noise generator mid-voltage level, the noise generator mid-voltage detector 60 will trip.

The noise generator mid-voltage detector 60 is comprised of an inverter 76 and a latch 78. The inverter 76 has an input coupled to the input 12A of the oscillator circuit 12. The output of the inverter 76 is coupled to the latch 78. The latch 78 has a first input coupled to the output of the latch 70 of the noise generator high voltage detector 58, a second input coupled to the output of the inverter 76, and a third input coupled to the enable noise generator signal outputted by the prestress circuit 18. The latch 78 further has an output which outputs an enable signal to the start-up detect circuit 14 when the proper conditions are met.

The inverter 76 is a standard inverter which comprises a P-channel transistor which is coupled to an N-channel transistor. Those skilled in the art will recognize that by altering the width to length ratio of the P-channel transistor to the N-channel transistor, one may alter the value at which the inverter 76 will trip, thereby enabling one to set the predetermined noise generator mid-voltage level.

Figure 3B:
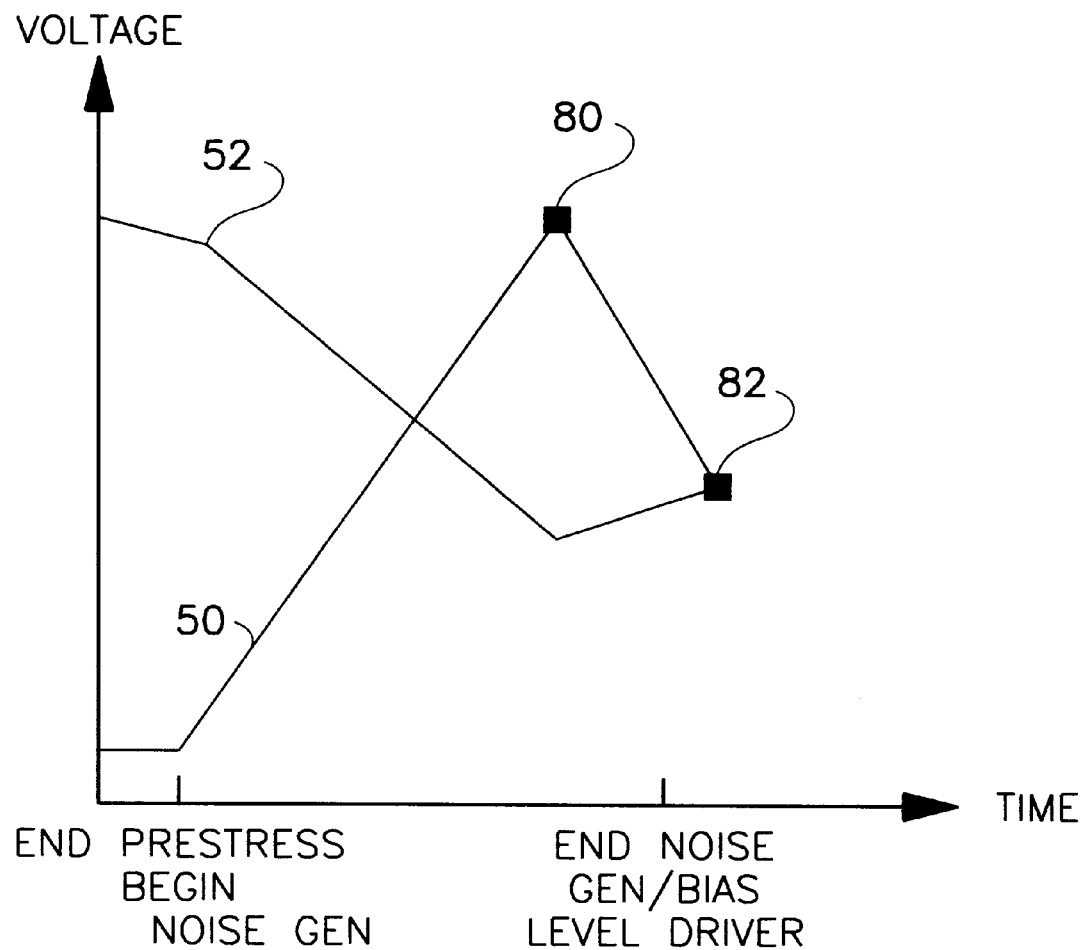
FIG. 3B depicts the voltage waveform for the low power fast starting oscillator depicted in FIG. 1 when the noise generator is activated.

Referring now to FIGS. 3A and 3B wherein like numerals and symbols represent like elements, FIG. 3B shows a voltage diagram of the oscillator circuit 12 (FIG. 1) when the noise generator 16 is activated. The enable noise generator signal which is outputted by the prestress circuit 18 (FIG. 1) is used to reset the latches 70 and 78. The enable noise generator signal further activates the noise generator pull-up circuit 54 which causes the input voltage (line 50) to be pulled towards the bias voltage of the pull-up transistor 64. When the voltage at the input 12A (FIG. 1) of the oscillator circuit 12 reaches or exceeds the noise generator high voltage level 80, the noise generator high voltage detector 58 will trip. The noise generator high voltage detector 58 will then output a signal which deactivates the noise generator pull-up circuit 54 and which activates the noise generator pull-down circuit 56.

When the noise generator pull-down circuit 56 is activated, the pull-down transistor 74 will try to lower the voltage at the input 12A of the oscillator circuit 12. The input voltage will be pulled towards ground potential until the input voltage of the oscillator circuit 12 reaches or falls below the noise generator mid-voltage level 82. When the input voltage reaches or falls below the noise generator mid-voltage level 82, the noise generator mid-voltage detector 60 will trip causing the latch 78 of the noise generator mid-voltage detector 60 to output an enable signal to the start-up detect circuit 14 (FIG. 1).

After start-up, the oscillator circuit losses cause the oscillator circuit 12 to stabilize (i.e., loop gain is approximately one). The oscillator circuit 12 then enters a steady state operating mode. However, high gain was required to ensure a fast and reliable start-up. This creates a problem since in steady state operation, the high gain wastes power. Furthermore, the high gain may result in piezoelectric resonator overdrive.

In order to lower the gain of the oscillator circuit 12 once a steady state operating mode has been obtained, a start-up detect circuit 14 is coupled to the oscillator circuit 12. The start-up detect circuit 14 is used for monitoring the output 12B of the oscillator circuit 12 in order to determine when the oscillator circuit 12 has reached steady state operation. Once a steady state operating mode has been achieved, the start-up detect circuit 14 generates a signal which is used to lower the gain of the oscillator circuit 12 and thus lower the power consumption of the oscillator 10.

Figure 4A:
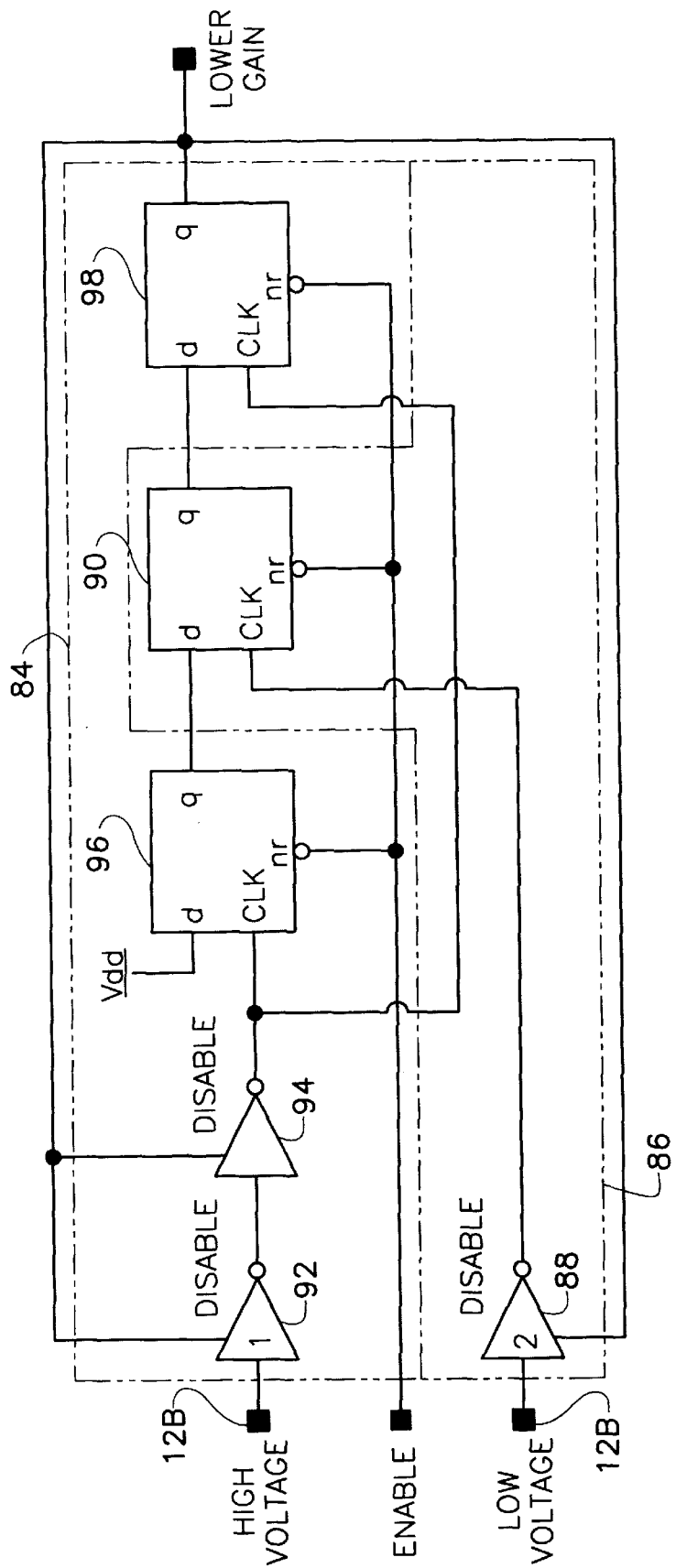
FIG. 4A is a simplified electrical schematic of a start-up detect circuit used in the low power fast starting oscillator depicted in FIG. 1.

Referring now to FIG. 4A wherein like numerals and symbols represent like elements, the start-up detect circuit 14 is shown in detail. The start-up detect circuit 14 is comprised of a start-up detect high voltage detector 84 and a start-up detect low voltage detector 86. The start-up detect low voltage detector 86 is coupled to the output 12B of the oscillator circuit 12. The start-up detect low voltage detector 86 is used for monitoring the output 12B of the oscillator circuit 12. When the oscillator circuit 12 generates an output signal having the desired frequency and at a desired low amplitude, the start-up detect low voltage detector 86 will generate a start-up detect low voltage output signal.

The start-up detect low voltage detector 86 has an inverter 88 which has an input coupled to the output 12B of the oscillator circuit 12. When the oscillator circuit 12 generates an output signal having the desired frequency and at a desired low amplitude, the inverter 88 will trip and will send a signal to the latch 90.

The inverter 88 is a standard inverter which comprises a P-channel transistor which is coupled to an N-channel transistor. Those skilled in the art will recognize that by altering the width to length ratio of the P-channel transistor to the N-channel transistor, one may alter the value at which the inverter 88 will trip, thereby enabling one to set the predetermined start-up detect low-voltage level.

The start-up detect high voltage detector 84 is also coupled to the output 12B of the oscillator circuit 12 and further to the start-up detect low voltage detector 86. The start-up detect high voltage detector 84 is used for monitoring the output 12B of the oscillator circuit 12, for generating a first start-up detect high voltage output signal when the oscillator circuit 12 generates an output signal of the desired frequency and having a desired high amplitude for a first time. The first start-up detect high voltage output signal further allows the start-up detect low voltage detector 86 to generate the start-up detect low voltage output signal after the output 12B of the oscillator circuit 12 generates the output signal of a desired frequency and having the desired low amplitude. The start-up detect high voltage detector 84 further is used to generate a second start-up detect high voltage output signal which adjusts the gain of the oscillator circuit 12 when the output 12B of the oscillator circuit 12 generates an output signal of the desired frequency and having the desired high amplitude for a second time.

The start-up detect high voltage detector 84 has a first inverter 92 which is coupled to the output 12B of the oscillator circuit 12. The inverter 92 will trip when the oscillator circuit 12 generates an output signal of the desired frequency and having a desired high amplitude for a first time. The inverter 92 has an output which is coupled to an input of a second inverter 94. The output of the inverter 94 is coupled to a latch 96. The latch 96 has a first input which is coupled to a bias voltage source, a second input coupled to the output of the second inverter 94, and a third input coupled to the enable start-up detect signal which is outputted by the noise generator 16. The latch 96 further has an output which is coupled to the first input of the latch 90 of the start-up detect low voltage detector 86. The start-up detect high voltage detector 84 further has a second latch 98 which is coupled to an output of the latch 90 of the start-up detect low voltage detector 86. The latch 98 has a first input which is coupled to the output of the latch 90, a second input coupled to the output of the second inverter 94, and a third input coupled to the enable start-up detect signal. The latch 98 further has an output which is coupled to the inverting amplifier 20 of the oscillator circuit 12. When appropriate conditions are met (i.e., steady-state operating conditions), the latch 98 will send a signal to lower the gain of the inverting amplifier 20 in order to lower the power consumption of the oscillator 10.

The inverter 92 is a standard inverter which comprises a P-channel transistor which is coupled to an N-channel transistor. Those skilled in the art will recognize that by altering the width to length ratio of the P-channel transistor to the N-channel transistor, one may alter the value at which the inverter 92 will trip, thereby enabling one to set the predetermined start-up detect high-voltage level.

Figure 4B:
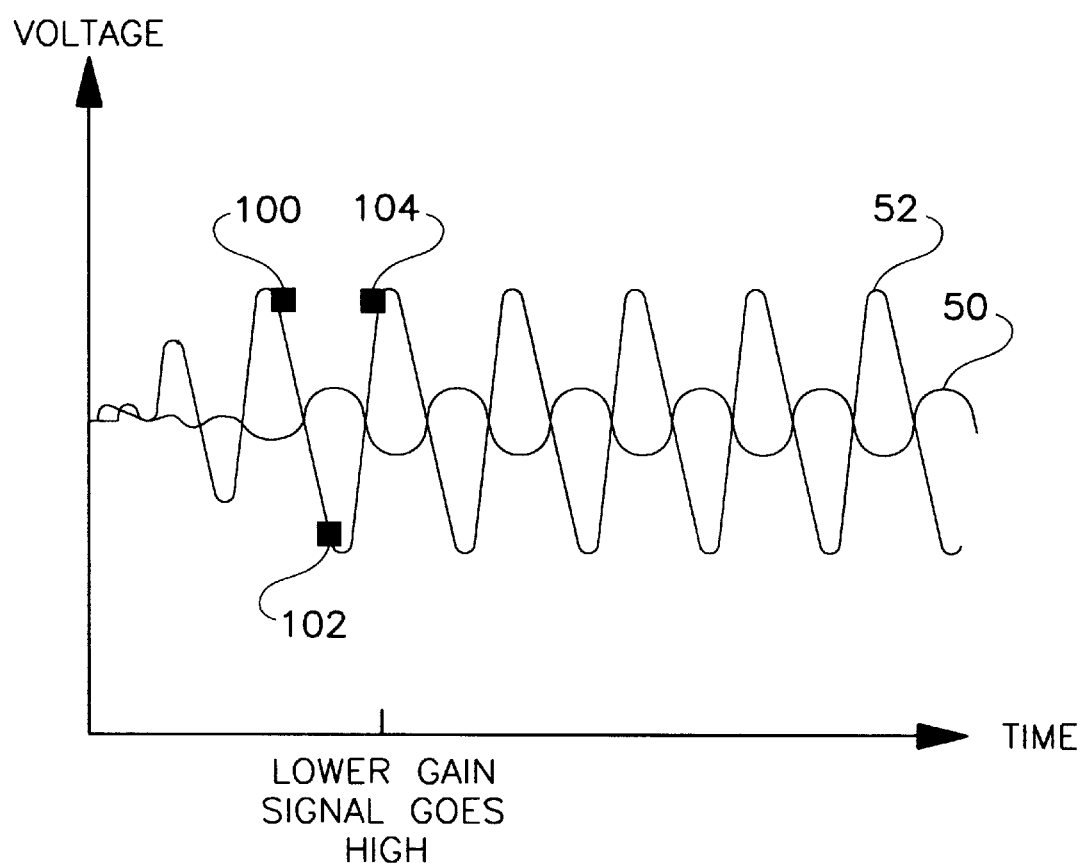
FIG. 4B depicts the voltage waveform for the low power fast starting oscillator depicted in FIG. 1 when the start-up detect circuit is activated.

Referring now to FIGS. 4A and 4B wherein like numerals and symbols represent like elements, FIG. 4B shows a voltage diagram of the oscillator circuit 12 (FIG. 1) when the start-up detect circuit 14 is activated. The enable start-up detect signal which is outputted by the noise generator circuit 16 (FIG. 1) enables the start-up detect circuit 14 and further is used to reset the latches 90, 96, and 98.

When the start-up detect circuit 14 is enabled, the start-up detect high voltage detector will monitor the output voltage (line 52) of the oscillator circuit 12. When the oscillator circuit 12 generates an output signal of the desired frequency and having a desired high amplitude for a first time 100, the start-up detect high voltage detector 84 will generate the first start-up detect high voltage output signal which is sent to the latch 90 of the start-up detect low voltage detector 86. The start-up detect low voltage detector 86 now monitors the output 12B of the oscillator 12. When the oscillator circuit 12 generates an output voltage (line 52) having the desired frequency and at a desired low amplitude 102, the inverter 88 will trip and will send a signal to the latch 90. The latch 90 will then output a start-up detect low voltage signal to the latch 98. When the output voltage (line 52) reaches the desired high amplitude for a second time 104, the latch 98 will send a signal to adjust the gain of the oscillator circuit 12.

It should be noted that only one stage (i.e., prestress circuit 18, noise generator 16, or start-up detect circuit 14) is active at a time. It should further be noted that the inverters 32, 34, 66, 68, 76, 88, 92, and 94 are all coupled to the outputs of their respective stages. When a stage is completed, the inverters in that stage will be deactivated. This further reduces the power consumption of the oscillator 10.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A low power oscillator having fast start-up times comprising, in combination:

an oscillator circuit for generating a signal of a desired frequency;

a prestress circuit coupled to an input and to an output of said oscillator circuit for prestressing a piezoelectric resonator of said oscillator circuit to shorten start-up times of said oscillator circuit; and a noise generator coupled to said input of said oscillator circuit and to said prestress circuit for inputting a noise pulse into said oscillator circuit and for biasing said input of said oscillator circuit to approximately an optimal bias voltage level.

2. A low power oscillator having fast start-up times in accordance with claim 1 further comprising a start-up detect circuit coupled to said output of said oscillator circuit and to said noise generator for detecting when said oscillator circuit has reached steady state operation.

3. A low power oscillator having fast start-up times in accordance with claim 2 wherein said start-up detect circuit adjusts a gain of said oscillator circuit when steady state operation has been reached by said oscillator circuit to lower power consumption of said oscillator circuit.

4. A low power oscillator having fast start-up times in accordance with claim 1 wherein said oscillator circuit comprises:

an amplifier;

a resistor having a first terminal coupled to an input of said amplifier and a second terminal coupled to an output of said amplifier for biasing said amplifier into a linear operation region;

a piezoelectric resonator having a first terminal coupled to said input of said amplifier and a second terminal coupled to said output of said amplifier for setting said desired frequency of oscillation of said oscillator circuit; and a pair of capacitive elements wherein a first capacitive element is coupled to said input of said amplifier and a second capacitive element is coupled to said output of said amplifier for adjusting a gain of said amplifier.

5. A low power oscillator having fast start-up times in accordance with claim 4 wherein said piezoelectric resonator is a crystal resonator.

6. A low power oscillator having fast start-up times in accordance with claim 4 wherein said piezoelectric resonator is a ceramic resonator.

7. A low power oscillator having fast start-up times in accordance with claim 4 wherein said oscillator circuit further comprises a switch coupled to said first terminal of said resistor and to said input of said amplifier for activating and deactivating said resistor.

8. A low power oscillator having fast start-up times in accordance with claim 7 wherein said switch is a transistor switch.

9. A low power oscillator having fast start-up times in accordance with claim 8 wherein said transistor switch is a P-channel transistor switch.

10. A low power oscillator having fast start-up times in accordance with claim 1 wherein said prestress circuit comprises:
   a prestress pull-down circuit coupled to said input of said oscillator circuit for lowering a voltage level at said input of said oscillator circuit;
   a prestress low voltage detector coupled to said input of said oscillator circuit for generating a prestress low voltage indicator signal when said voltage level at said input of said oscillator circuit is one of at or below a preset low voltage level;
   a prestress high voltage detector coupled to said output of said oscillator circuit for generating a prestress high voltage indicator signal when a voltage level at said output of said oscillator circuit is one of at or above a preset high voltage level; and
   an enabling circuit coupled to said prestress low voltage detector, said prestress high voltage detector, and to said prestress pull-down circuit for generating a prestress output signal when said prestress low voltage detector generates said prestress low voltage indicator signal and said prestress high voltage detector generates said prestress high voltage indicator signal.

11. A low power oscillator having fast start-up times in accordance with claim 10 wherein said prestress low voltage detector is an inverter which trips at said preset low voltage level.

12. A low power oscillator having fast start-up times in accordance with claim 10 wherein said prestress high voltage detector is an inverter which trips at said preset high voltage level.

13. A low power oscillator having fast start-up times in accordance with claim 10 wherein said enabling circuit comprises:
   an enabling circuit logic gate having a first input coupled to an inverted output of said prestress low voltage detector and a second input coupled to an inverted output of said prestress high voltage detector; and
   a latch having a first input coupled to a bias voltage, a second input coupled to an output of said enabling circuit logic gate, a reset input coupled to a prestress enable signal which enables said prestress circuit, and an output for outputting said prestress output signal when said prestress low voltage detector generates said prestress low voltage indicator signal and said prestress high voltage detector generates said prestress high voltage indicator signal.

14. A low power oscillator having fast start-up times in accordance with claim 13 wherein said enabling circuit logic gate is an AND gate.

15. A low power oscillator having fast start-up times in accordance with claim 10 wherein said prestress pull-down circuit comprises:
   a prestress pull-down circuit logic gate having an inverted input coupled to said enabling circuit, and a second input coupled to a prestress enable signal which enables said prestress circuit; and
   a prestress pull-down transistor having a first terminal coupled to said input of said oscillator circuit, a second input coupled to an output of said prestress pull-down circuit logic gate, and a third terminal coupled to ground.

16. A low power oscillator having fast start-up times in accordance with claim 15 wherein said prestress pull-down circuit logic gate is an AND gate.

17. A low power oscillator having fast start-up times in accordance with claim 15 wherein said prestress pull-down transistor is an N-channel transistor.

18. A low power oscillator having fast start-up times in accordance with claim 1 wherein said noise generator comprises:
   a noise generator pull-up circuit coupled to said input of said oscillator circuit for increasing a voltage level at said input of said oscillator circuit;
   a noise generator pull-down circuit coupled to said input of said oscillator circuit for decreasing said voltage level at said input of said oscillator circuit;
   a noise generator high voltage detector coupled to said input of said oscillator circuit, to said noise generator pull-up circuit, and to said noise generator pull-down circuit for deactivating said noise generator pull-up circuit once said voltage level at said input of said oscillator circuit reaches a predetermined noise generator high voltage level and for activating said noise generator pull-down circuit; and
   a noise generator mid-voltage detector coupled to said input of said oscillator circuit and to said noise generator pull-down circuit for deactivating said noise generator pull-down circuit once said voltage level at said input of said oscillator circuit reaches a predetermined noise generator mid-voltage level.

19. A low power oscillator having fast start-up times in accordance with claim 18 wherein said noise generator pull-up circuit comprises:
   a noise generator pull-up circuit logic gate having an inverted input coupled to said noise generator high voltage detector, and a second input coupled to a noise generator enable signal which enables said noise generator and said noise generator pull-up circuit; and
   a noise generator pull-up transistor having a first terminal coupled to a bias voltage source, a second terminal coupled to an output of said noise generator pull-up circuit logic gate, and a third terminal coupled to said input of said oscillator circuit.

20. A low power oscillator having fast start-up times in accordance with claim 19 wherein said noise generator pull-up circuit logic gate is a NAND gate.

21. A low power oscillator having fast start-up times in accordance with claim 19 wherein said noise generator pull-up transistor is a P-channel transistor.

22. A low power oscillator having fast start-up times in accordance with claim 18 wherein said noise generator pull-down circuit comprises:
   a noise generator pull-down circuit logic gate having an inverted input coupled to said noise generator mid-voltage detector, and a second input coupled to said noise generator high voltage detector; and
   a noise generator pull-down transistor having a first terminal coupled to said input of said oscillator circuit, a second terminal coupled to an output of said noise generator pull-down circuit logic gate, and a third terminal coupled to ground.

23. A low power oscillator having fast start-up times in accordance with claim 22 wherein said noise generator pull-down circuit logic gate is an AND gate.

24. A low power oscillator having fast start-up times in accordance with claim 19 wherein said noise generator pull-down transistor is an N-channel transistor.

25. A low power oscillator having fast start-up times in accordance with claim 18 wherein said noise generator high voltage detector comprises:

a noise generator first inverter coupled to said input of said oscillator circuit for generating a noise generator high voltage indicator signal when said voltage level of said input of said oscillator circuit is one of at or above said predetermined noise generator high voltage level;

a noise generator second inverter having an input coupled to an output of said noise generator first inverter; and a noise generator high voltage detector latch having a first input coupled to a bias voltage source, a second input coupled to an output of said noise generator second inverter, a third input coupled to a noise generator enable signal, and an output coupled to said noise generator pull-down circuit and said noise generator mid-voltage detector for activating said noise generator pull-down circuit.

26. A low power oscillator having fast start-up times in accordance with claim 18 wherein said noise generator mid-voltage detector comprises:

a noise generator third inverter coupled to said input of said oscillator circuit for generating a noise generator mid-voltage indicator signal when said voltage level of said input of said oscillator circuit is one of at or below said predetermined noise generator mid-voltage level; and a noise generator mid-voltage detector latch having a first input coupled to said noise generator high voltage detector, a second input coupled to an output of said noise generator third inverter, a third input coupled to a noise generator enable signal, and an output coupled to said noise generator pull-down circuit for deactivating said noise generator pull-down circuit.

27. A low power oscillator having fast start-up times in accordance with claim 3 wherein said start-up detect circuit further comprises:

a start-up detect low voltage detector coupled to said output of said oscillator circuit for monitoring said output of said oscillator circuit and for generating a start-up detect low voltage output signal when said output of said oscillator circuit generates said signal of said desired frequency and having a desired low amplitude; and a start-up detect high voltage detector coupled to said output of said oscillator circuit and to said start-up detect low voltage detector for monitoring said output of said oscillator circuit, for generating a first start-up detect high voltage output signal when said output of said oscillator circuit generates said signal of said desired frequency and having a desired high amplitude for a first time and which allows said start-up detect low voltage detector to generate said start-up detect low voltage output signal after said output of said oscillator circuit generates said signal of said desired frequency and having said desired low amplitude, and for generating a second start-up detect high voltage output signal which adjusts a gain of said oscillator circuit when said output of said oscillator circuit generates said signal of said desired frequency and having said desired high amplitude for a second time.

28. A low power oscillator having fast start-up times in accordance with claim 27 wherein said first start-up detect high voltage detector comprises:

a start-up circuit high voltage detector first inverter coupled to said output of said oscillator circuit for generating a high amplitude indicator signal when said output of said oscillator circuit generates said signal of said desired frequency and having said desired high amplitude;

a start-up circuit high voltage detector second inverter having an input coupled to an output of said start-up circuit high voltage detector first inverter; and a start-up circuit high voltage detector first latch having a first input coupled to a bias voltage source, a second input coupled to an output of said start-up circuit high voltage detector second inverter, a third input coupled to a start-up circuit enable signal, and an output coupled to said start-up circuit low voltage detector which allows said low voltage detector to generate said start-up detect low voltage output signal when said output of said oscillator circuit generates said signal of said desired frequency and having said desired low amplitude.

29. A low power oscillator having fast start-up times in accordance with claim 28 wherein said start-up circuit high voltage detector further comprises a start-up circuit high voltage detector second latch having a first input coupled to said start-up circuit low voltage detector, a second input coupled to said start-up circuit high voltage detector second inverter, a third input coupled to said start-up circuit enable signal, and an output coupled to said oscillator circuit for generating a second start-up detect high voltage output signal which adjusts said gain of said oscillator circuit when said output of said oscillator circuit generates said signal of said desired frequency and having said desired high amplitude for said second time.

30. A low power oscillator having fast start-up times in accordance with claim 27 wherein said start-up circuit low voltage detector comprises:

a start-up circuit low voltage detector inverter having an input coupled to said output of said oscillator circuit; and a start-up circuit low voltage detector latch having a first input coupled to said start-up circuit high voltage detector, a second input coupled to an output of said start-up circuit low voltage detector inverter, a third input coupled to a start-up circuit enable signal, and an output coupled to said start-up circuit high voltage detector which outputs said start-up detect low voltage output signal when said output of said oscillator circuit generates said signal of said desired frequency and having said desired low amplitude.

31. A low power oscillator having fast start-up times comprising, in combination:

an oscillator circuit having an input and an output for generating a signal of a desired frequency;

a start-up detect circuit coupled to said output of said oscillator circuit for detecting when said oscillator circuit has reached steady state operation and for generating a start-up circuit output signal which adjusts a gain of said oscillator circuit when steady state operation has been reached by said oscillator circuit;

a noise generator coupled to said input of said oscillator circuit and to said start-up detect circuit for inputting a noise pulse into said oscillator circuit, for biasing said input of said oscillator circuit to approximately an optimal bias voltage level, and for sending an enable start-up detect signal to said start-up detect circuit to activate said start-up detect circuit; and a prestress circuit coupled to said input and to said output of said oscillator circuit for prestressing a piezoelectric resonator of said oscillator circuit to shorten start-up times of said oscillator circuit and for sending an enable noise generator signal to said noise generator to activate said noise generator;

wherein said oscillator circuit comprises:
- an amplifier having an amplifier input and an amplifier output;
- a resistor having a first terminal coupled to said amplifier output for biasing said amplifier into a linear operation region;
- a switch coupled to a second terminal of said resistor and to said amplifier input for activating and deactivating said resistor;
- said piezoelectric resonator having a first terminal coupled to said amplifier input and a second terminal coupled to said amplifier output for generating said signal having said desired frequency of oscillation; and
- a pair of capacitive elements wherein a first capacitive element is coupled to said amplifier input and a second capacitive element is coupled to said amplifier output for adjusting again of said amplifier.

32. A low power oscillator having fast start-up times in accordance with claim 31 wherein said piezoelectric resonator is a crystal resonator.

33. A low power oscillator having fast start-up times in accordance with claim 31 wherein said piezoelectric resonator is a ceramic resonator.

34. A low power oscillator having fast start-up times in accordance with claim 31 wherein said switch is a P-channel transistor switch.

35. A low power oscillator having fast start-up times in accordance with claim 31 wherein said prestress circuit comprises:
- a prestress pull-down circuit coupled to said input of said oscillator circuit and to an enable signal line which enables said prestress circuit when said oscillator circuit is enabled for lowering a voltage level at said input of said oscillator circuit;
- a prestress low voltage detector coupled to said input of said oscillator circuit for generating a prestress low voltage indicator signal when said voltage level at said input of said oscillator circuit is one of at or below a preset low voltage level;
- a prestress high voltage detector coupled to said output of said oscillator circuit for generating a prestress high voltage indicator signal when a voltage level of said output of said oscillator circuit is one of at or above a preset high voltage level; and
- an enabling circuit coupled to said prestress low voltage detector, said prestress high voltage detector, to said prestress pull-down circuit, and to said enable signal line for generating said enable noise generator signal when said prestress low voltage detector generates said prestress low voltage indicator signal and said prestress high voltage detector generates said prestress high voltage indicator signal.

36. A low power oscillator having fast start-up times in accordance with claim 35 wherein said prestress low voltage detector is an inverter which trips at said preset low voltage level.

37. A low power oscillator having fast start-up times in accordance with claim 35 wherein said prestress high voltage detector is an inverter which trips at said preset high voltage level.

38. A low power oscillator having fast start-up times in accordance with claim 35 wherein said enabling circuit comprises:
- an enabling circuit logic gate having a first input coupled to an inverted output of said prestress low voltage detector and a second input coupled to an inverted output of said prestress high voltage detector; and
- a latch having a first input coupled to a bias voltage, a second input coupled to an output of said enabling circuit logic gate, a third input coupled to said enable signal line which enables said prestress circuit, and an output for outputting said enable noise generator signal to enable said noise generator after said prestress low voltage detector generates said prestress low voltage indicator signal and said prestress high voltage detector generates said prestress high voltage indicator signal.

39. A low power oscillator having fast start-up times in accordance with claim 38 wherein said enabling circuit logic gate is an AND gate.

40. A low power oscillator having fast start-up times in accordance with claim 35 wherein said prestress pull-down circuit comprises:
- a prestress pull-down circuit logic gate having an inverted input coupled to said enable noise generator signal, and a second input coupled to said enable signal line; and
- a prestress pull-down transistor having a first terminal coupled to said input of said oscillator circuit, a second input coupled to an output of said prestress pull-down circuit logic gate, and a third terminal coupled to ground.

41. A low power oscillator having fast start-up times in accordance with claim 40 wherein said prestress pull-down circuit logic gate is an AND gate.

42. A low power oscillator having fast start-up times in accordance with claim 40 wherein said prestress pull-down transistor is an N-channel transistor.

43. A low power oscillator having fast start-up times in accordance with claim 31 wherein said noise generator comprises:
- a noise generator pull-up circuit coupled to said input of said oscillator circuit and to said enable noise generator signal for increasing a voltage level at said input of said oscillator circuit;
- a noise generator pull-down circuit coupled to said input of said oscillator circuit, and to said noise generator pull-down circuit for decreasing said voltage level at said input of said oscillator circuit;
- a noise generator high voltage detector coupled to said input of said oscillator circuit, to said noise generator pull-up circuit, and to said noise generator pull-down circuit, and to said enable noise generator signal for deactivating said noise generator pull-up circuit once said voltage level at said input of said oscillator circuit reaches a predetermined noise generator high voltage level and for activating said noise generator pull-down circuit; and
- a noise generator mid-voltage detector coupled to said input of said oscillator circuit and to said noise generator pull-down circuit for deactivating said noise generator pull-down circuit once said voltage level at said input of said oscillator circuit reaches a predetermined noise generator mid-voltage level and for sending said enable start-up detect signal to said start-up detect circuit.

44. A low power oscillator having fast start-up times in accordance with claim 43 wherein said noise generator pull-up circuit comprises:
- a noise generator pull-up circuit logic gate having an inverted input coupled to said noise generator high voltage detector, and a second input coupled to a noise generator enable signal; and a noise generator pull-up transistor having a first terminal coupled to a bias voltage source, a second terminal coupled to an output of said noise generator pull-up circuit logic gate, and a third terminal coupled to said input of said oscillator circuit.

45. A low power oscillator having fast start-up times in accordance with claim 44 wherein said noise generator pull-up circuit logic gate is a NAND gate.

46. A low power oscillator having fast start-up times in accordance with claim 44 wherein said noise generator pull-up transistor is a P-channel transistor.

47. A low power oscillator having fast start-up times in accordance with claim 43 wherein said noise generator pull-down circuit comprises:
a noise generator pull-down circuit logic gate having an inverted input coupled to said noise generator mid-voltage detector, and a second input coupled to said noise generator high voltage detector; and
a noise generator pull-down transistor having a first terminal coupled to said input of said oscillator circuit, a second terminal coupled to an output of said noise generator pull-down circuit logic gate, and a third terminal coupled to ground.

48. A low power oscillator having fast start-up times in accordance with claim 47 wherein said noise generator pull-down circuit logic gate is an AND gate.

49. A low power oscillator having fast start-up times in accordance with claim 47 wherein said noise generator pull-down transistor is an N-channel transistor.

50. A low power oscillator having fast start-up times in accordance with claim 43 wherein said noise generator high voltage detector comprises:
a noise generator first inverter coupled to said input of said oscillator circuit for generating a noise generator high voltage indicator signal when said voltage level of said input of said oscillator circuit is one of at or above said predetermined noise generator high voltage level;
a noise generator second inverter having an input coupled to an output of said noise generator first inverter; and
a noise generator high voltage detector latch having a first input coupled to a bias voltage source, a second input coupled to an output of said noise generator second inverter, a third input coupled to a noise generator enable signal, and an output coupled to said noise generator pull-down circuit and said noise generator mid-voltage detector for activating said noise generator pull-down circuit.

51. A low power oscillator having fast start-up times in accordance with claim 43 wherein said noise generator mid-voltage detector comprises:
a noise generator third inverter coupled to said input of said oscillator circuit for generating a noise generator mid-voltage indicator signal when said voltage level of said input of said oscillator circuit is one of at or below said predetermined noise generator mid-voltage level; and
a noise generator mid-voltage detector latch having a first input coupled to a said noise generator high voltage detector, a second input coupled to an output of said noise generator third inverter, a third input coupled to a noise generator enable signal, and an output coupled to said noise generator pull-down circuit for deactivating said noise generator pull-down circuit and for generating said enable start-up detect signal.

52. A low power oscillator having fast start-up times in accordance with claim 31 wherein said start-up detect circuit further comprises:

a start-up detect low voltage detector coupled to said output of said oscillator circuit for monitoring said output of said oscillator circuit and for generating a start-up detect low voltage output signal when said output of said oscillator circuit generates said signal of said desired frequency and having a desired low amplitude; and a start-up detect high voltage detector coupled to said output of said oscillator circuit and to said start-up detect low voltage detector for monitoring said output of said oscillator circuit, for generating a first start-up detect high voltage output signal when said output of said oscillator circuit generates said signal of said desired frequency and having a desired high amplitude for a first time and which allows said start-up detect low voltage detector to generate said start-up detect low voltage output signal after said output of said oscillator circuit generates said signal of said desired frequency and having said desired low amplitude, and for generating a second start-up detect high voltage output signal which adjusts a gain of said oscillator circuit when said output of said oscillator circuit generates said signal of said desired frequency and having said desired high amplitude for a second time.

53. A low power oscillator having fast start-up times in accordance with claim 52 wherein said first start-up detect high voltage detector comprises:
a start-up circuit high voltage detector first inverter coupled to said output of said oscillator circuit for generating a high amplitude indicator signal when said output of said oscillator circuit generates said signal of said desired frequency and having said desired high amplitude;
a start-up circuit high voltage detector second inverter having an input coupled to an output of said start-up circuit high voltage detector first inverter; and
a start-up circuit high voltage detector first latch having a first input coupled to a bias voltage source, a second input coupled to an output of said start-up circuit high voltage detector second inverter, a third input coupled to a start-up circuit enable signal, and an output coupled to said start-up circuit low voltage detector which allows said low voltage detector to generate said start-up detect low voltage output signal when said output of said oscillator circuit generates said signal of said desired frequency and having said desired low amplitude.

54. A low power oscillator having fast start-up times in accordance with claim 53 wherein said start-up circuit high voltage detector further comprises a start-up circuit high voltage detector second latch having a first input coupled to said start-up circuit low voltage detector, a second input coupled to said start-up circuit high voltage detector second inverter, a third input coupled to said start-up circuit enable signal, and an output coupled to said oscillator circuit for generating a second start-up detect high voltage output signal which adjusts said gain of said oscillator circuit when said output of said oscillator circuit generates said signal of said desired frequency and having said desired high amplitude for said second time.

55. A low power oscillator having fast start-up times in accordance with claim 52 wherein said start-up circuit low voltage detector comprises:
a start-up circuit low voltage detector inverter having an input coupled to said output of said oscillator circuit; and a start-up circuit low voltage detector latch having a first input coupled to said start-up circuit high voltage detector, a second input coupled to an output of said start-up circuit low voltage detector inverter, a third input coupled to a start-up circuit enable signal, and an output coupled to said start-up circuit high voltage detector which outputs said start-up detect low voltage output signal when said output of said oscillator circuit generates said signal of said desired frequency and having said desired low amplitude.

* * * * *